US012733421B2

(12) United States Patent
Huang et al.

(10) Patent No.: US 12,733,421 B2
(45) Date of Patent: Sep. 8, 2026

(54) GAS PHASE TREATMENT FOR MANUFACTURING SEMICONDUCTOR STRUCTURE

(71) Applicant: TAIWAN SEMICONDUCTOR MANUFACTURING COMPANY, LTD., Hsinchu (TW)

(72) Inventors: Yao-Sheng Huang, Hsinchu (TW); Hsiang-Pi Chang, Hsinchu (TW); Shen-Yang Lee, Hsinchu (TW); Huang-Lin Chao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 423 days.

(21) Appl. No.: 18/298,094

(22) Filed: Apr. 10, 2023

(65) Prior Publication Data

US 2024/0339329 A1 Oct. 10, 2024

(51) Int. Cl.

*H10P 50/28* (2026.01)
*H10D 64/01* (2025.01)
*H10P 14/20* (2026.01)

(52) U.S. Cl.

CPC ......... *H10P 50/283* (2026.01); *H10D 64/027* (2025.01); *H10P 14/271* (2026.01); *H10P 14/3411* (2026.01)

(58) Field of Classification Search

CPC .................. H01L 37/32733; C23F 4/00; H01J 2237/334; H10P 50/242

See application file for complete search history.

(56) References Cited

U.S. PATENT DOCUMENTS

| | | | | |
|---|---|---|---|---|
| 12,513,984 | B2 * | 12/2025 | Mishra | H10D 84/853 |
| 2015/0126039 | A1 * | 5/2015 | Korolik | H01L 21/3065 438/719 |
| 2016/0068969 | A1 * | 3/2016 | Cui | H01J 37/32853 216/67 |
| 2023/0360921 | A1 * | 11/2023 | Flaugh | H01L 21/02252 |
| 2025/0166989 | A1 * | 5/2025 | Varnell | H01L 21/0214 |

* cited by examiner

*Primary Examiner* — Thomas T Pham

(74) *Attorney, Agent, or Firm* — Birch, Stewart, Kolasch & Birch, LLP

(57) ABSTRACT

A method for manufacturing a semiconductor structure includes trimming a semiconductor region using a gaseous halogen-based etchant such that the trimmed semiconductor region has a first part and a second part which is formed on the first part and which has a halogen-terminated trimmed surface, and treating the halogen-terminated trimmed surface of the second part using a gaseous oxidant including hydrogen and oxygen such that the second part is oxidized to form an oxidized part, and such that the halogen-terminated trimmed surface is converted into a hydroxyl group-terminated surface of the oxidized part.

20 Claims, 11 Drawing Sheets

GAS PHASE TREATMENT FOR MANUFACTURING SEMICONDUCTOR STRUCTURE

BACKGROUND

Transistors are key active components in modern integrated circuits (IC). With rapid development of semiconductor technology, critical dimension (CD) of transistors keeps shrinking and various three-dimensional (3D) transistor structures are springing up, making it possible to integrate a large number of transistors per unit area. Meanwhile, for each type of structural design of the transistors, some process steps in a corresponding one of methods for forming the transistors will become more critical, and thus, methods for manufacturing advanced node transistors are in continuous development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
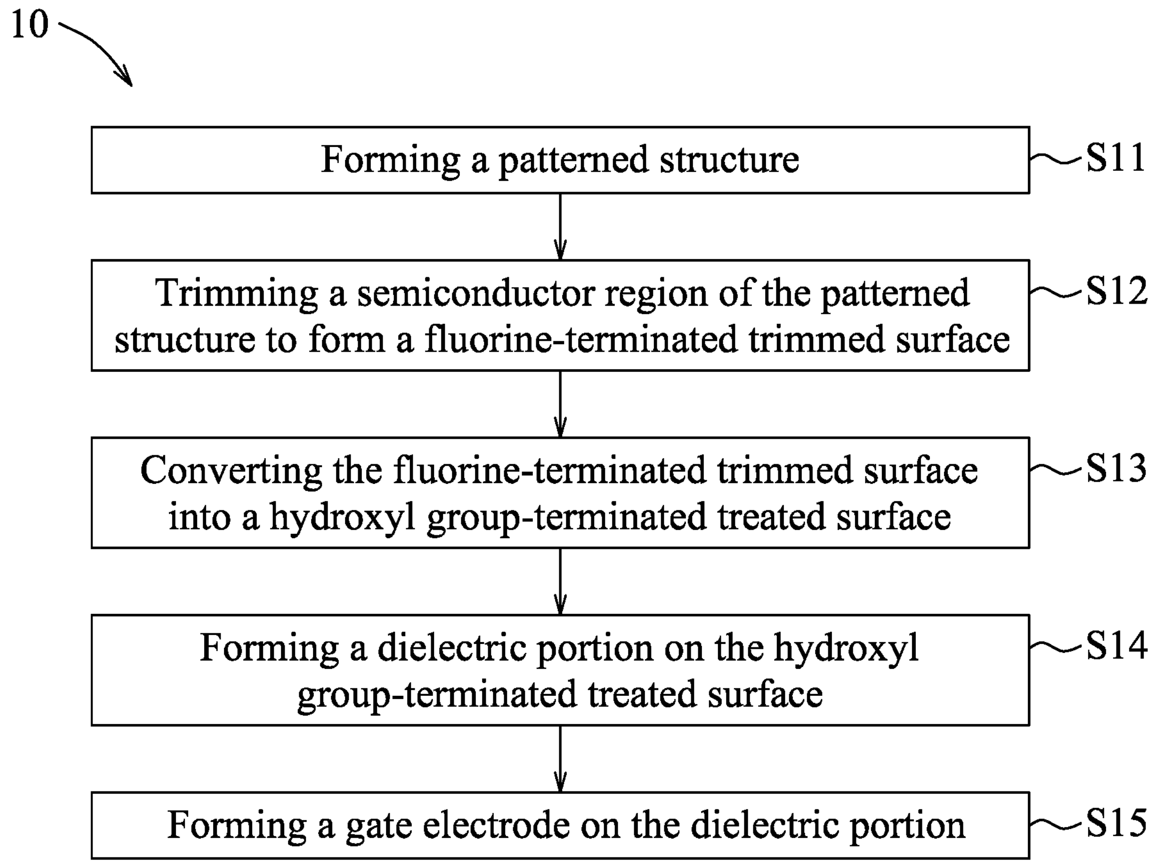
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, and other numerical values used in the specification and claims, are to be understood as being modified in all instances by the term "about" even though the term "about" may not expressly appear with the value, amount or range. Accordingly, unless indicated to the contrary, the numerical parameters set forth in the following specification and attached claims are not and need not be exact, but may be approximate and/or larger or smaller as desired, reflecting tolerances, conversion factors, rounding off, measurement error and the like, and other factors known to those of skill in the art depending on the desired properties sought to be obtained by the presently disclosed subject matter. For example, the term "about," when referring to a value can be meant to encompass variations of, in some aspects ±10%, in some aspects ±5%, in some aspects ±2.5%, in some aspects ±1%, in some aspects ±0.5%, and in some aspects ±0.1% from the specified amount, as such variations are appropriate to perform the disclosed methods or employ the disclosed compositions.

With the rapid development of semiconductor technology, the structural design of the device has evolved from bulk silicon-based devices, silicon on insulator-based (SOI-based) devices, Fin-type transistors (FinFETs), gate-all-around transistors (GAAFETs), nanosheet GAAFETs, nanowire GAAFETs, forksheet-based devices, to complementary transistors (CFET, a stack of FETs). In addition to size miniaturization so as to achieve a high integration density, the direction of a current flow from a source to a drain will evolve from horizontal (i.e., lateral FET, LFET) to vertical (i.e., vertical FET, VFET) in the next technology node. As such, nanowire-shaped channels or nanosheet-shaped channels may be elongated vertically and arranged in an array, and can be arranged more regularly and closely with one another. However, when the vertical channels individually stand on a substrate without being supported, a spin-dry step widely used in a wet process (for example, but not limited to, wet etching, wet cleaning, etc.) may cause collapse of the vertical channels due to centrifugal force generated during rotation. Therefore, the present disclosure is directed to a dry process for manufacturing a semiconductor structure prior to vertical features being supported. The semiconductor structure may be applied to devices with different structures (e.g., the devices described above), other three-dimensional transistors, or other suitable devices. The method of the present disclosure is extremely advantageous for the structure (or the device) including vertical channels without being supported.

Figure 17:
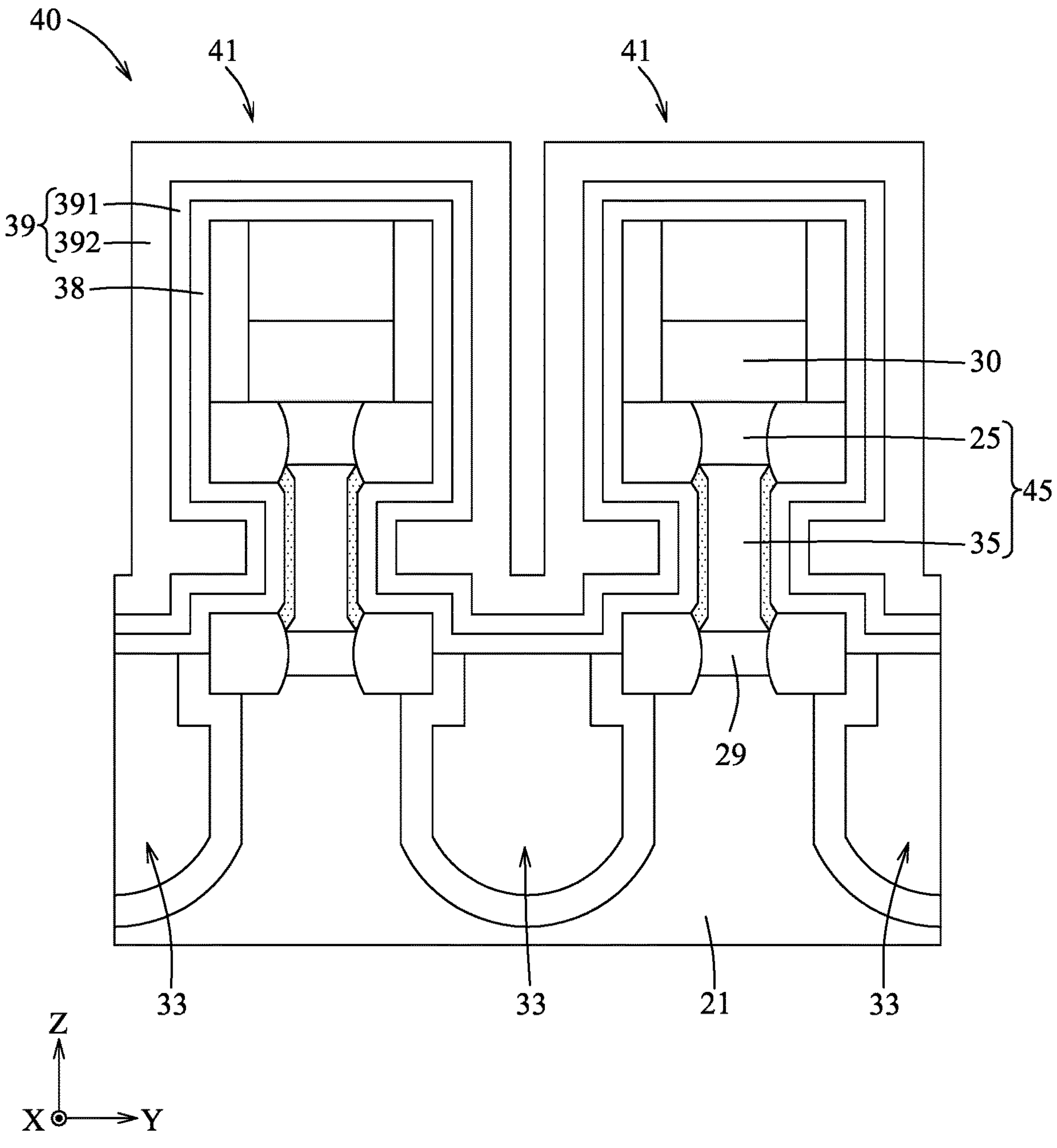
Figure 18:
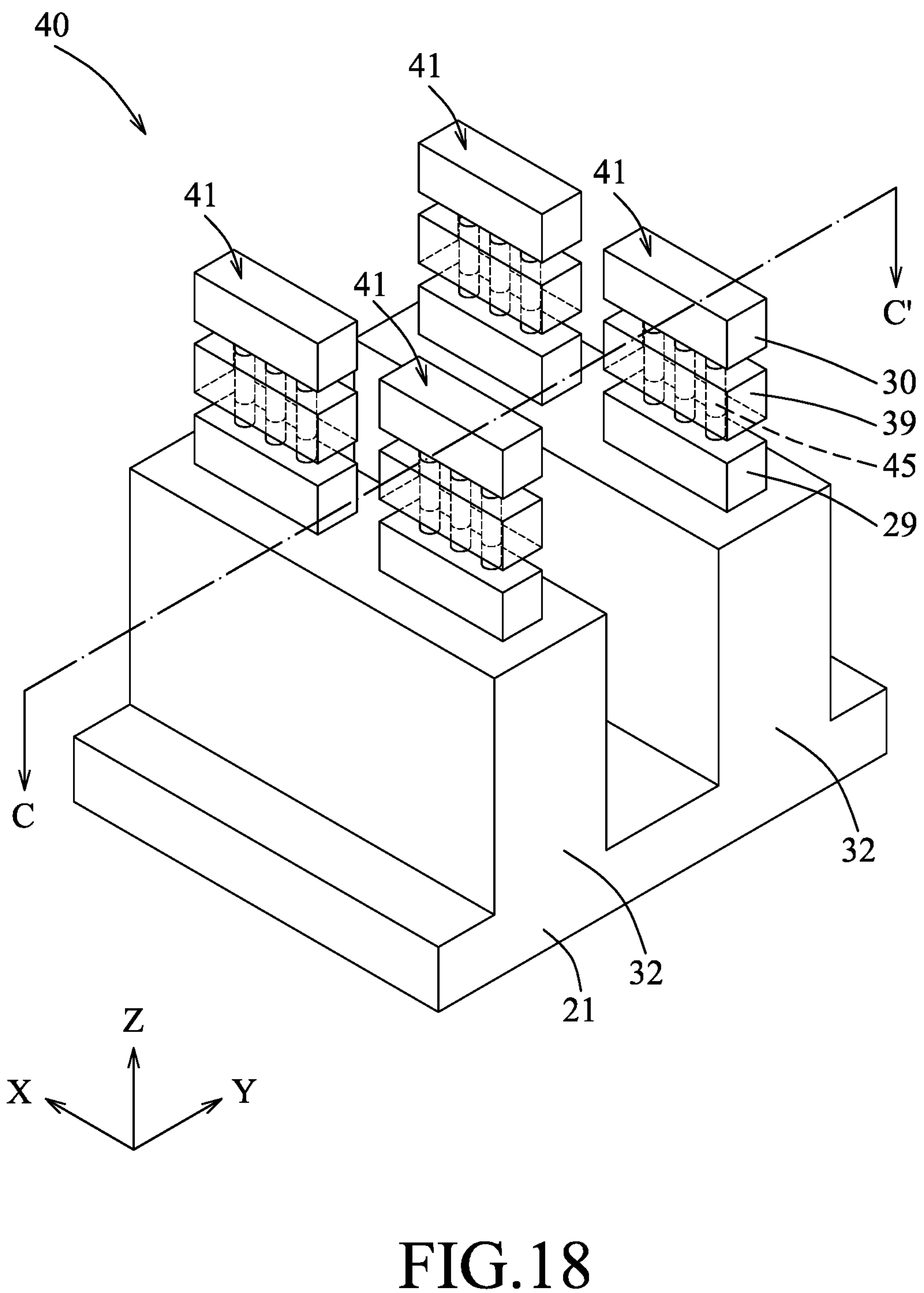

FIG. 1 is a flow diagram illustrating a method 10 for manufacturing a semiconductor structure (for example, the semiconductor structure 40 including a plurality of device units 41 shown in FIG. 18) in accordance with some embodiments. FIGS. 2 to 10 and 17 to 18 illustrate schematic views of intermediate stages of the method 10 in accordance with some embodiments. Some repeating structures are omitted in FIGS. 2 to 10 and 17 to 18 for the sake of brevity.

Figure 2:
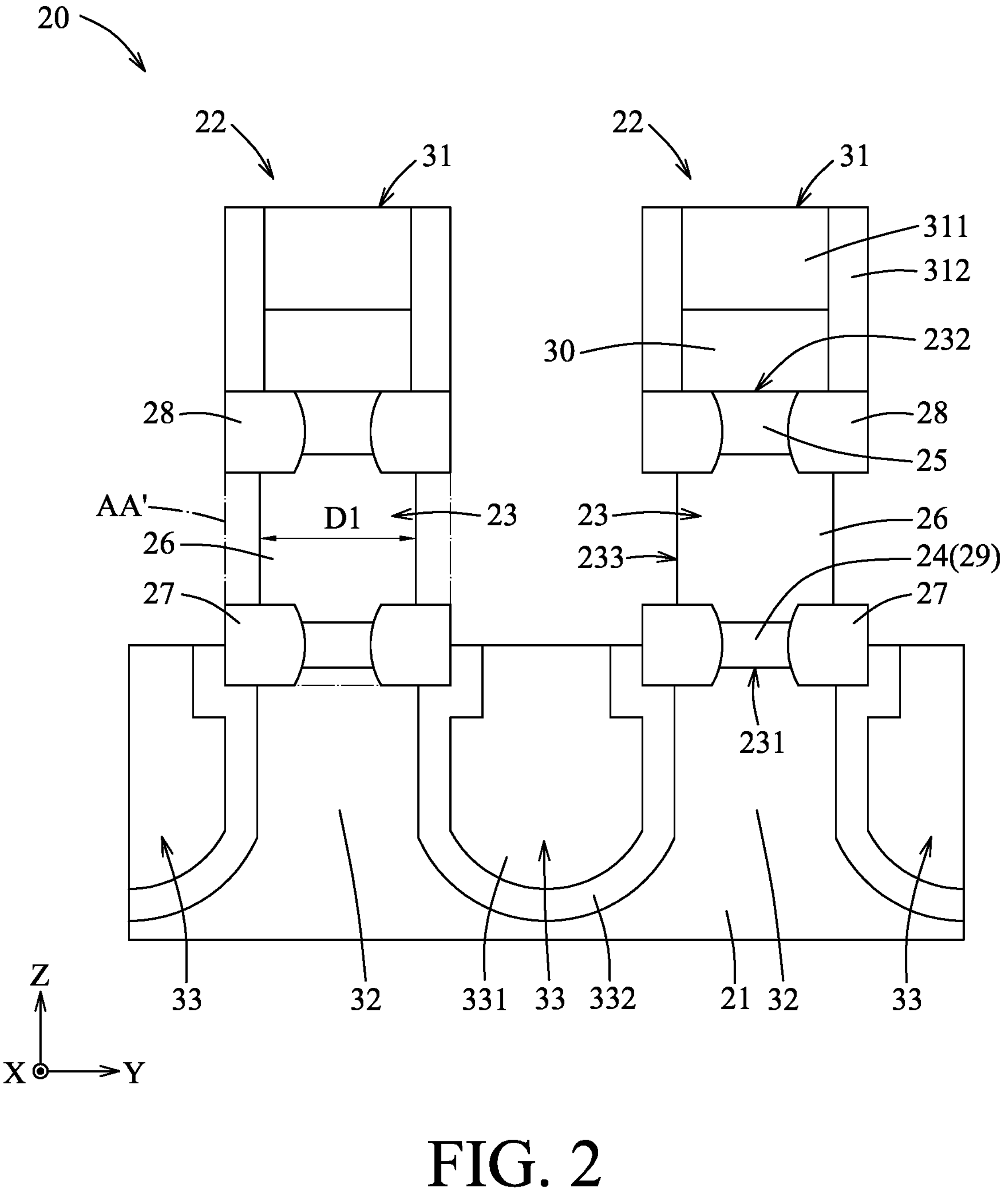
FIGS. 2 to 10 and 17 to 18 illustrate schematic views of intermediate stages of the method depicted in FIG. 1 in accordance with some embodiments.

Referring to FIG. 1 and the example illustrated in FIG. 2, the method 10 begins at step S11 where a patterned structure 20 is formed. FIG. 2 is a schematic cross-sectional view of the patterned structure 20 in accordance with some embodiments. The patterned structure 20 includes a substrate 21 and a plurality of patterned units 22 (two of which are shown in FIG. 2) disposed over the substrate 21.

In some embodiments, the substrate 21 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. In addition, the substrate 21 may be a bulk silicon substrate, a silicon-on-insulator (SOI) substrate, or a germanium-on-insulator (GOI) substrate. Other suitable materials for the substrate 21 are within the contemplated scope of the present disclosure.

Each of the patterned units 22 includes at least one semiconductor portion 23. In some embodiments, as shown in FIG. 2, the semiconductor portion 23 of one of the patterned units 22 is spaced apart from the semiconductor portion 23 of an adjacent one of the patterned units 22 in a Y direction.

The semiconductor portion 23 is formed over the substrate 21, and is elongated in a Z direction transverse to the Y direction. In some embodiments, the semiconductor portion 23 may be made from a material the same as or different from that of the substrate 21. Since suitable materials for the semiconductor portion 23 are similar to those for the substrate 21, the details thereof are omitted for the sake of brevity.

In some embodiments, the semiconductor portion 23 has a lower surface 231 proximate to the substrate 21, an upper surface 232 distal from the substrate 21, and an outer peripheral surface 233 interconnecting the lower and upper surfaces 231, 232. In some embodiments, the semiconductor portion 23 includes a lower region 24 having the lower surface 231, an upper region 25 having the upper surface 232, and a middle region 26 disposed between the lower and upper regions 24, 25. Each of the lower and upper regions 24, 25 may be made of a material which is the same as or different from that of the middle region 26. In some embodiments, the middle region 26 is made of silicon.

Figure 3:
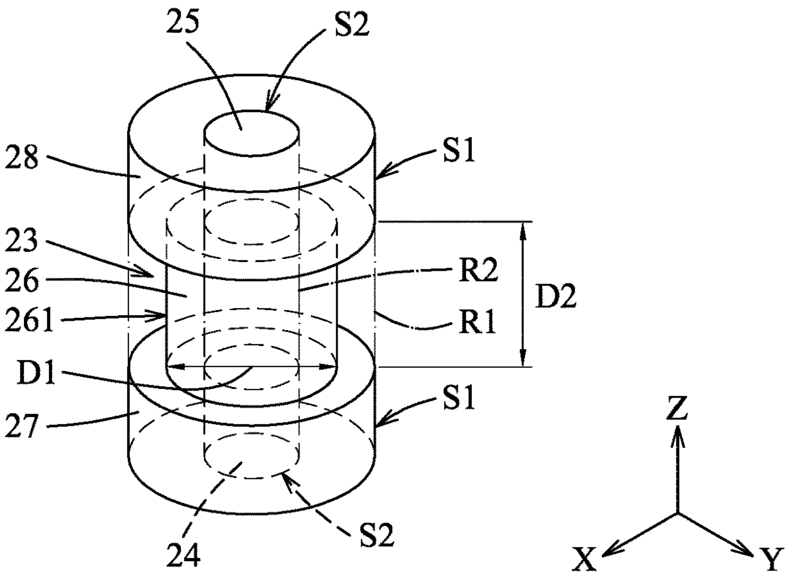
Figure 4:
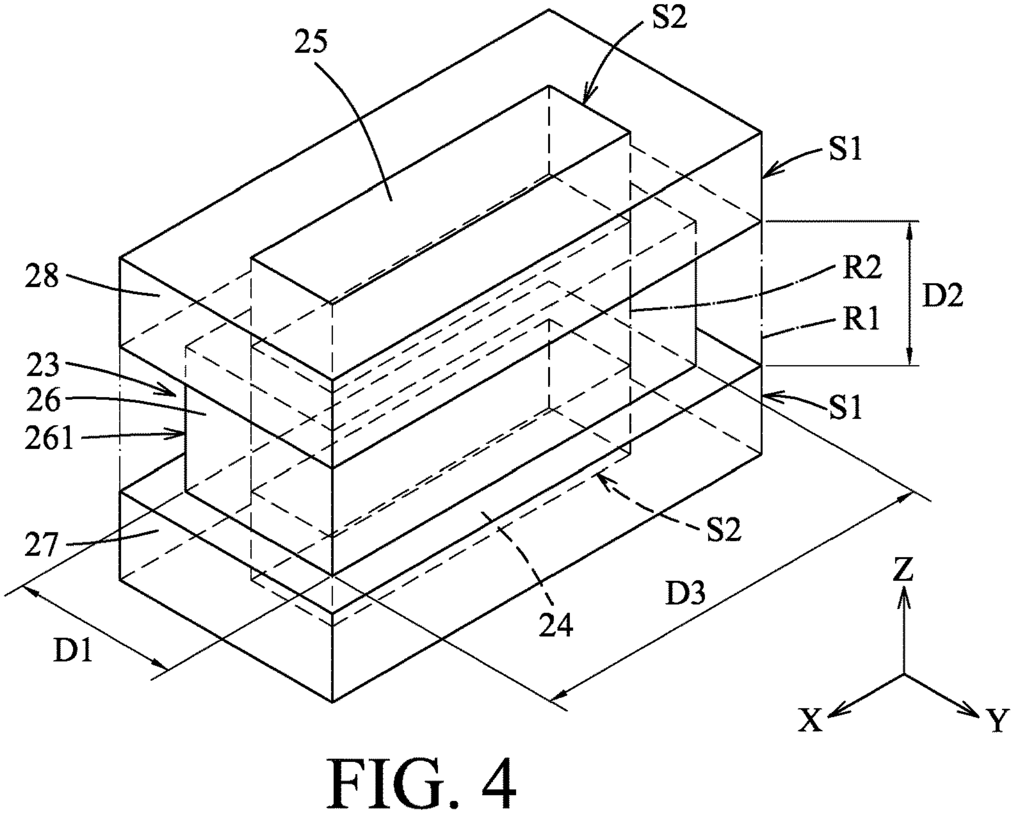

FIG. 3 is a partially enlarged perspective view of area AA' in FIG. 2 in accordance with some embodiments. FIG. 4 is another partially enlarged perspective view of area AA' in FIG. 2 in accordance with some other embodiments. In some embodiments, each of the patterned units 22 shown in FIG. 2 may include a plurality of the structures shown in FIG. 3, which are displaced from each other in an X direction transverse to both the Y and Z directions, so as to obtain a corresponding one of the device units 41 shown in FIG. 18 in the following steps. In some embodiments, the X, Y and Z directions are perpendicular to one another. In some embodiments, as shown in FIG. 3, the semiconductor portion 23 may be configured as a nanowire elongated in the Z direction, and the middle region 26 has a diameter of D1 (see also FIG. 2), and has a length of D2 in the Z direction. In some other embodiments, as shown in FIG. 4, the semiconductor portion 23 may be configured as a nanosheet which is not only elongated in the Z direction, but also extends in the X direction, such that the middle region 26 has a thickness of D1 in the Y direction, a width of D3 in the X direction, and a length of D2 in the Z direction. In some embodiments, the semiconductor portions 23 of the patterned units 22 may have a dimension (e.g., a diameter of a nanowire or a thickness of a nanosheet) substantially the same with each other in the Y direction, as shown in FIG. 2. In some not shown embodiments, the dimension of the semiconductor portions 23 of the patterned units 22 may be different from each other.

In some embodiments, when the patterned units 22 are designed for respectively forming the device units 41 which are configured as vertical GAA transistors as shown in FIG. 18, the middle region 26 of the semiconductor portion 23 in each of the patterned units 22 will be treated to serve as a channel of a corresponding one of the device units 41 in subsequent processes. The number of the semiconductor portion 23 in each of the patterned units 22 (or the number of the channel in the corresponding device unit 41) may vary according to practical application requirements. For example, although for each of the patterned units 22, a single one of the semiconductor portion 23 can be seen in FIG. 2, any one of the patterned units 22 may include a plurality of the semiconductor portions 23 which are arranged in the X direction. It should be noted that although the method 10 is exemplified using a method for manufacturing a GAA structure including a plurality of vertical GAA transistors (i.e., the device units 41, four of which are shown in FIG. 18), the method 10 may be used for manufacturing other suitable structures. In some embodiments, the number of the patterned units 22 or the number of the device units 41 respectively formed from the patterned units 22 can vary according to the circuit design of the semiconductor structure 40 (see also FIG. 18).

In some embodiments, each of the patterned units 22 may further include a lower gate spacer 27 and an upper gate spacer 28 respectively formed around the lower and upper regions 24, 25 such that the middle region 26 is exposed from the lower and upper gate spacers 27, 28. Each of the lower and upper spacers 27, 28 has an outer surface S1 and an inner surface S2 opposite to the outer surface S1, as shown in FIGS. 3 and 4. In some embodiments, the outer surface S1 of at least one of the lower and upper spacers 27, 28 is coincident with a first surface R1, and the inner surface S2 of the at least one of the lower and upper gate spacers 27, 28 is coincident with a second surface R2. In some embodiments, each of the lower and upper gate spacers 27, 28 may include a dielectric material, such as silicon oxide, silicon nitride, silicon carbide, silicon oxynitride, silicon oxycarbide, silicon carbonitride, silicon oxycarbonitride, etc. Other dielectric materials suitable for forming the lower and upper gate spacers 27, 28 are within the contemplated scope of the present disclosure. It is noted that material properties (e.g., density, etching selectivity, etc.) of the dielectric material may vary according to process parameter(s) (e.g., temperature, pressure, etc.) during formation of the dielectric material.

In some embodiments, the middle region 26 has an exposed surface 261 (i.e., a portion of the outer peripheral surface 233, as shown in FIG. 2) exposed from the lower and upper gate spacers 27, 28. In some embodiments, the exposed surface 261 of the middle region 26 extends between the lower and upper gate spacers 27, 28, and is located between the first and second surfaces R1, R2, as shown in FIGS. 3 and 4.

In some embodiments, each of the patterned units 22 may further includes a lower source/drain portion 29 formed in the lower region 24, an upper source/drain portion 30 formed on the upper region 25, and a protection portion 31 formed to cover the upper source/drain portion 30 so as to prevent the upper source/drain portion 30 from being influenced in subsequent processes.

In some embodiments, each of the lower and upper source/drain portions 29, 30 may independently include single crystalline or polycrystalline silicon, single crystalline or polycrystalline silicon germanium, or other suitable materials. Each of the lower and upper source/drain portions 29, 30 may be independently doped with an n-type impurity to have an n-type conductivity or doped with a p-type impurity to have a p-type conductivity. In some embodiments, each of the lower and upper source/drain portions 29, 30 may be independently formed as a single layer structure or a multi-layered structure having several sub-layers with different doping concentration. In some embodiments, the p-type impurity may be, for example, but not limited to, boron (B), aluminum (Al), gallium (Ga), indium (In), other suitable materials, or combinations thereof. In some embodiments, the n-type impurity may be, for example, but not limited to, nitrogen (N), phosphorous (P), arsenic (As), antimony (Sb), other suitable materials, or combinations thereof. It is noted that each of the lower and upper source/drain portions 29, 30 may refer to a source or a drain, individually or collectively dependent upon the context. In some embodiments, formation of the lower and upper source/drain portions 29, 30 may be performed using an epitaxial growth process including chemical vapor deposition (CVD), molecular-beam epitaxy (MBE), an epitaxial deposition/partial etch process, such as a cyclic deposition-etch (CDE) process and/or a selective epitaxial growth (SEG) process, but is not limited thereto. In some embodiments, the n-type impurity and the p-type impurity may be in-situ doped along with the formation of the lower and upper source/drain portions 29, 30. In some other embodiments, the n-type impurity and the p-type impurity may be post doped after the formation of the lower and upper source/drain portions 29, 30.

In some embodiments, the upper region 25 may be doped with the p-type impurity or the n-type impurity to have a conductivity type the same with that of the upper source/drain portion 30. The upper region 25 has a doping concentration which is less than that of the upper source/drain portion 30, and may be referred to as a lightly doped drain (LDD) region.

In some embodiments, as shown in FIG. 2, the protection portion 31 includes a cap region 311 formed on an upper surface of the upper source/drain portion 30, and a wall region 312 formed aside the upper source/drain portion 30, so that the upper source/drain portion 30 is well protected. In some embodiments, the wall region 312 is further located on the upper gate spacer 28, and has an upper surface flush with that of the cap region 311. In some embodiments, the protection portion 31 may be made of a dielectric material. In some embodiments, the dielectric materials for the cap region 311, the wall region 312, and the lower and upper gate spacers 27, 28 may be different from each other. Since suitable dielectric materials for the protection portion 31 are similar to those for the lower and upper gate spacers 27, 28, the details thereof are omitted for the sake of brevity. Other suitable materials and/or configurations for the protection portion 31 are within the contemplated scope of the present disclosure.

In some embodiments, the patterned structure 20 may further include a plurality of base structures 32 each of which is formed between the substrate 21 and the lower source/drain portion 29 of a corresponding one of the patterned units 22, and a plurality of isolation portions 33 which are formed on the substrate 21 to alternate with the base structures 32 in the Y direction for isolation.

In some embodiments, the base structures 32 may be configured as a fin shape, as shown in FIG. 18. That is, each of the base structures 32 protrudes from the substrate 21 by a certain height in the Z direction, elongate by a length in the X direction, and has a width in the Y direction, such that the patterned units 22 (or the device units 41 respectively formed from the patterned units 22) may be arranged in the X direction and supported thereon. In some embodiments, the width of each of the base structures 32 may be the same as, greater than or less than that of one of the middle regions 26 which is disposed thereabove. It is noted that the middle region 26 of the semiconductor portion 23 is free from being covered by the isolation portions 33. In some embodiments, the base structures 32 may be made from a material the same as or different from that of the substrate 21. Since suitable materials for the base structure 32 are similar to those for the substrate 21, the details thereof are omitted for the sake of brevity. In some embodiments, the material(s) for forming the base structures 32 may be undoped. In some other embodiments, the material(s) for forming the base structures 32 may be doped with p-type impurities or n-type impurities for reducing leakage current flowing from one of the device units 41 to an adjacent one of the device units 41 through the substrate 21.

In some embodiments, each of the isolation portions 33 includes a main body 331, and a liner 332 disposed to separate the main body 331 from two adjacent ones of the base structures 32. In some embodiments, the main body 331 may be a portion of a shallow trench isolation (STI), a deep trench isolation (DTI), or other suitable structures, and may be made of an oxide material (for example, silicon oxide), a nitride material (for example, silicon nitride), or a combination thereof. In some embodiments, the liner 332 may be made of silicon nitride for isolation improvement. Other suitable materials for the isolation portions 33 are within the contemplated scope of the present disclosure.

In some embodiments, the patterned structure 20 may be made using any suitable processes (e.g., one or more deposition processes (such as CVD, atomic layer deposition (ALD), other suitable processes, or combinations thereof), one or more photolithography processes for forming patterned photomask(s) or patterned hark mask(s) (such as coating a photoresist, exposing the photoresist through a photomask, developing the photoresist, etching using the photoresist, stripping the photoresist, and/or other suitable processes), and/or one or more etching processes for patterning (such as dry etching, wet etching, other suitable processes, combinations thereof)), and thus details thereof are omitted for the sake of brevity.

Referring to FIG. 1, the method 10 proceeds to step S12 where a semiconductor region of the patterned structure is trimmed by a dry etching process using a gaseous halogen-based etchant, such that the trimmed semiconductor region has a first part and a second part which is formed on the first part and which has a halogen-terminated trimmed surface.

Figure 5:
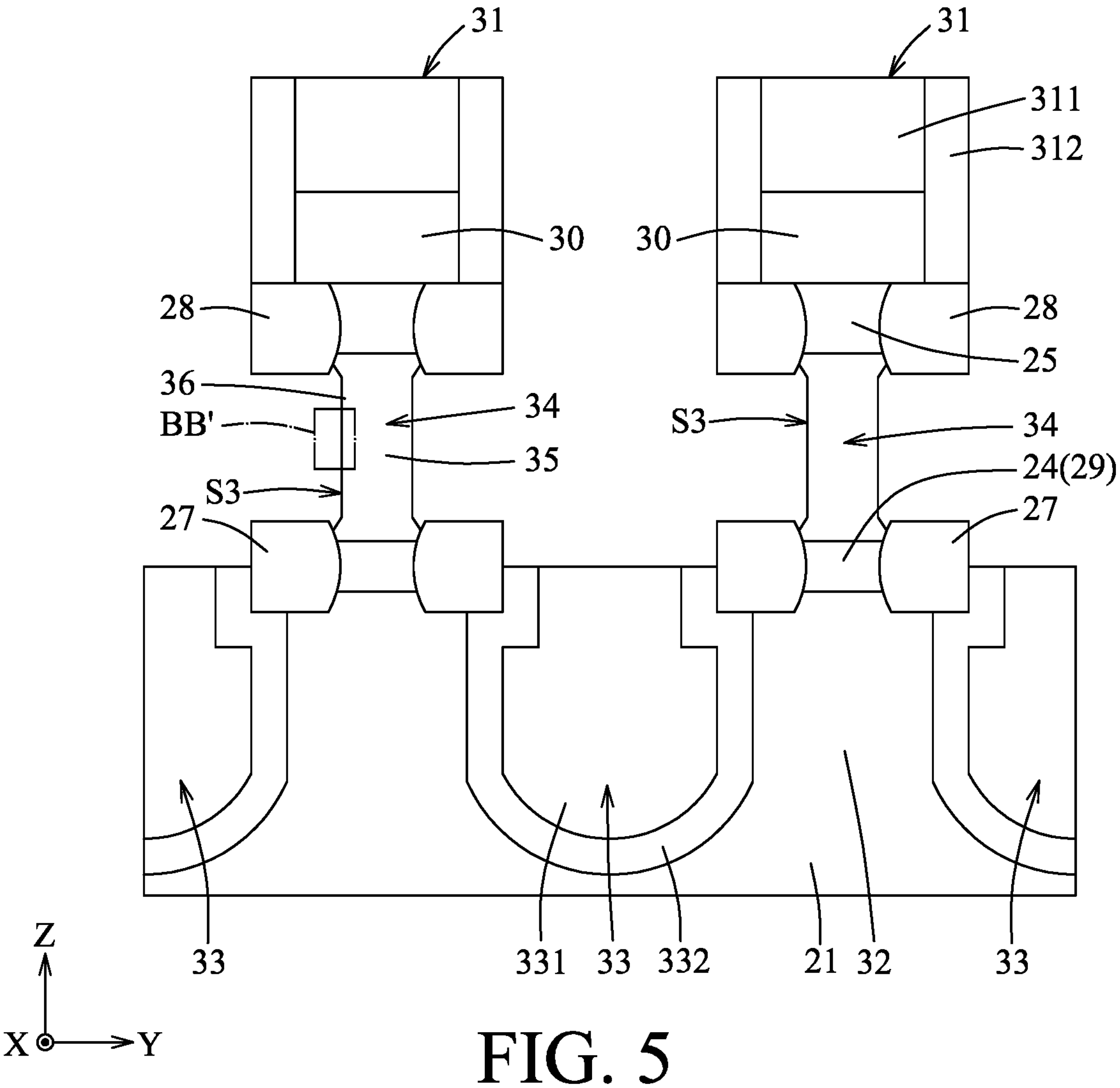

In some embodiments, as shown in FIG. 5 which is a view similar to that of FIG. 2, but illustrating the structure after step S12, the patterned structure 20 (see FIG. 2) is treated by a dry etching process using the gaseous halogen-based etchant which may include, such as fluorine, chlorine, or a combination thereof. Since the dry etching process is a selective etching process, the middle region 26 of the semiconductor portion 23, which is made of silicon, is trimmed (or etched) in a direction toward the second surface R2 (see FIGS. 3 and 4), while the protection portion 31, the upper source/drain portion 30 which is protected by the protection portion 31, the lower and upper gate spacers 27, 28, and the lower and upper regions 24, 25 of the semiconductor portion 23 which are respectively protected by the lower and upper gate spacers 27, 28 are substantially intact. After step S12, the trimmed middle region, which is denoted by 34, has an inner part 35 and an outer part 36 which surrounds the inner part 35. In some embodiments, since the gaseous halogen-based etchant is used in the dry etching process, it is believed that the outer part 36 has a trimmed surface S3 with halogen termination. In some embodiments, the trimmed surface S3 may be concave. In some embodiments, the trimmed surface S3 may have a flat surface region, a lower curved surface region extending between the lower gate spacer 27 and the flat surface region, and an upper curved surface region extending between the upper gate spacer 28 and the flat surface region. In addition, the trimmed middle region 34 may have a dimension in the Y direction similar to that of each of the lower and upper regions 24, 25. The dimension of the trimmed middle region 34 may be controlled by adjusting process parameter(s) (e.g., trimming time, etc.) in step S12.

In some embodiments, when the gaseous halogen-based etchant includes fluorine, a precursor gas for generating such gaseous halogen-based etchant may include hydrogen fluoride and nitrogen trifluoride, and gaseous reactant(s) produced by a reaction between the hydrogen fluoride and the nitrogen fluoride serve as the gaseous halogen-based etchant. Such gaseous halogen-based etchant has a higher etching selectivity (or a higher etching rate) over the middle region 26, which is made of silicon, than the lower and upper gate spacers 27, 28, the protection portion 31, and the isolation portions 33, which are made of a dielectric material (such as the examples described in the preceding paragraph). According to composition of the dielectric material(s), the lower and upper gate spacers 27, 28, the protection portion 31, and the isolation portions 33 are substantially intact or slightly etched after step S12. For example, the dielectric material of silicon nitride may have much less material loss relative to the dielectric material of silicon oxide during trimming of the middle region 26.

Figure 6:
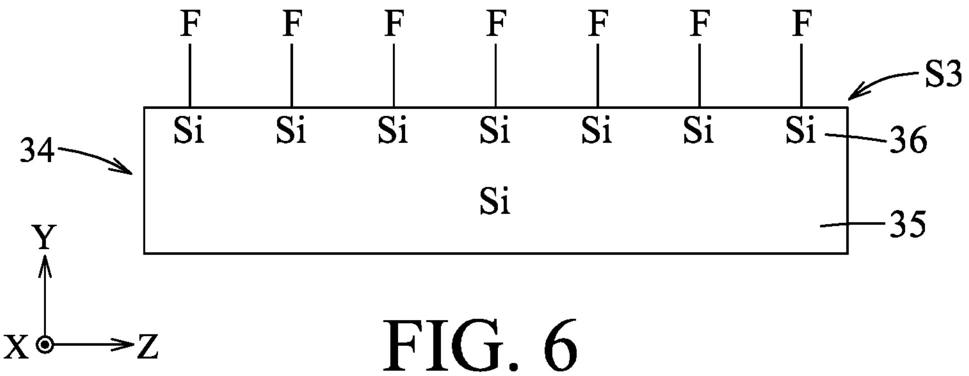

FIG. 6 is a partially enlarged view of area BB' in FIG. 5 in accordance with some embodiment. In FIG. 6, the trimmed surface S3 of the outer part 36 with fluorine termination is schematically illustrated in the case that the gaseous etchant used in the dry etching process includes, for example, but not limited to, fluorine.

As shown in FIG. 6, fluorine elements from the gaseous halogen-based etchant are coupled or bonded to silicon elements at the trimmed surface S3 after the dry etching process such that a fluorine-terminated trimmed surface is obtained. Likewise, in some not shown embodiments, when the gaseous halogen-based etchant includes chlorine, chlorine elements from the gaseous halogen-based etchant may be coupled or bonded to the silicon elements located at the trimmed surface S3 after the dry etching process such that a chlorine-terminated trimmed surface may be obtained. Such fluorine-terminated trimmed surface (or chlorine-terminated trimmed surface) may promote the reaction to be performed in the next step.

Referring to FIG. 1, the method 10 proceeds to step S13 where the halogen-terminated trimmed surface of the second part is treated with a gaseous oxidant including hydrogen and oxygen, such that the second part is oxidized to form an oxidized part, and such that the halogen-terminated trimmed surface is converted into a hydroxyl group-terminated surface of the oxidized part.

Figure 7:
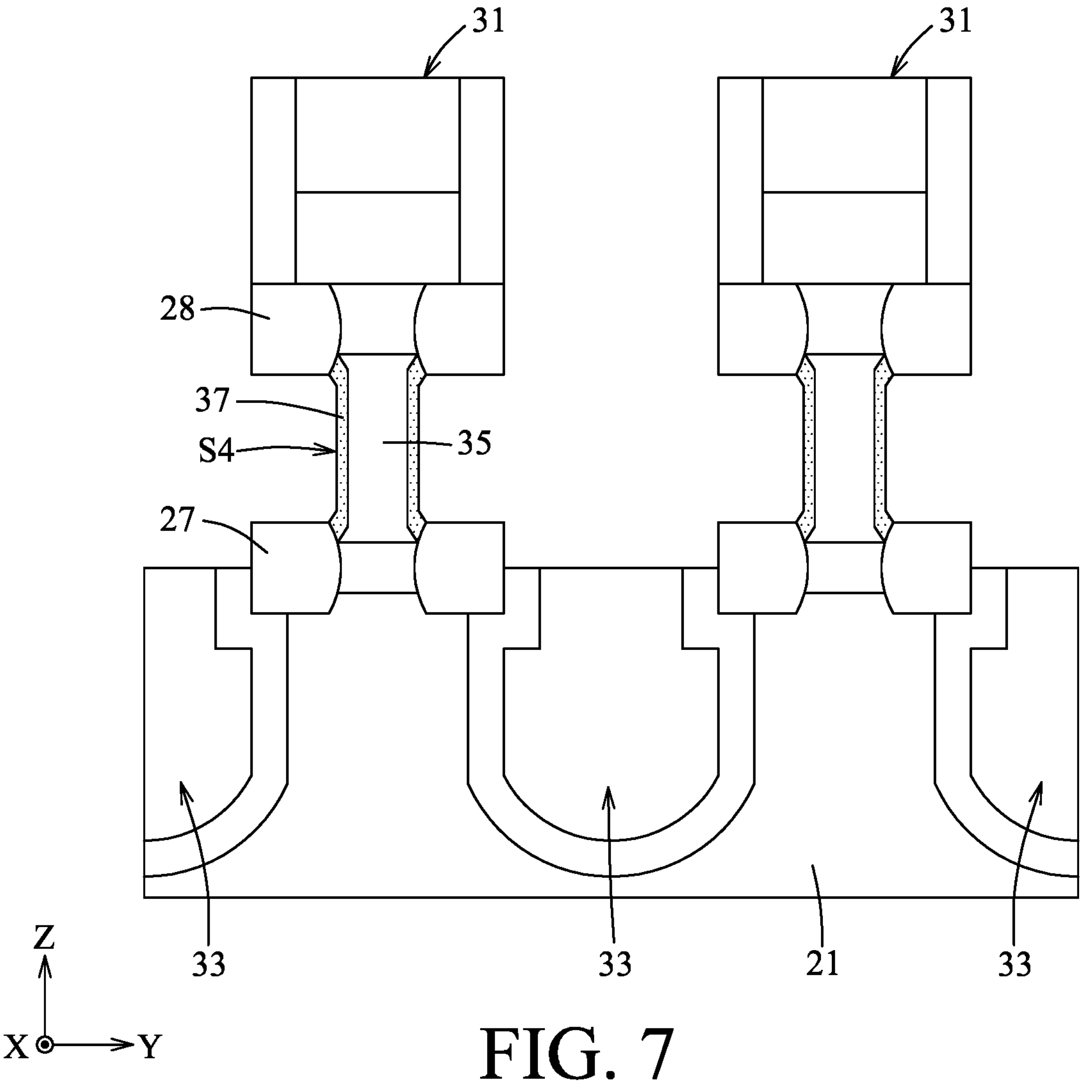
Figure 8:
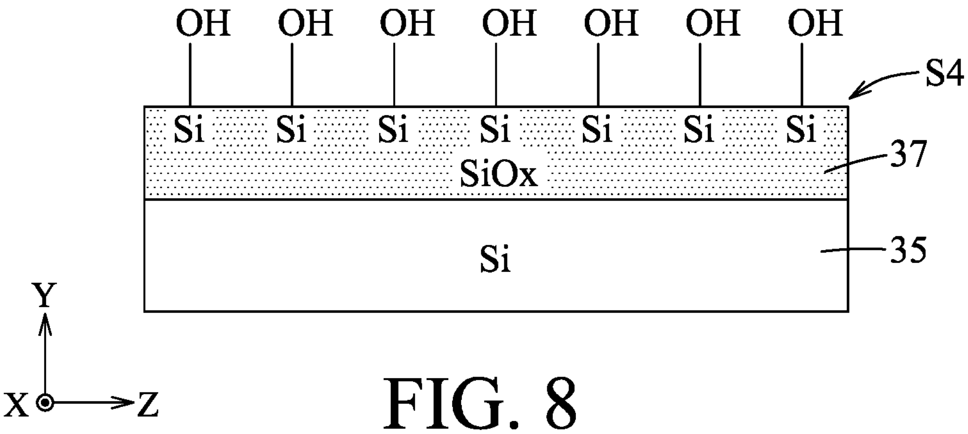

In some embodiments, as shown in FIGS. 7 and 8 which are views similar to those of FIGS. 5 and 6, respectively, but illustrating the structures after step S13, the trimmed surface S3 of the outer part 36 is treated using a gaseous oxidant including hydrogen and oxygen, such that the outer part 36 (see FIGS. 5 and 6) is oxidized to form an interfacial layer 37 which is made of silicon oxide, and which is disposed around the inner part 35. In addition, the trimmed surface S3 with halogen termination (for example, but not limited to, the fluorine-terminated trimmed surface, as shown in FIG. 6) is converted into a treated surface S4 of the interfacial layer 37 with hydroxyl group termination. In detail, during treatment of the trimmed surface S3 of the outer part 36, the fluorine elements, which are originally coupled or bonded to the silicon elements (see FIG. 6), react with the gas oxidant such that the fluorine elements are removed in a form of gaseous hydrogen fluoride, and such that the hydroxyl groups are coupled or bonded to the silicon elements (see FIG. 8). Such hydroxyl group-terminated treated surface may promote the reaction to be performed in the next step.

In some embodiments, a precursor gas for generating the gaseous oxidant includes a gas mixture of hydrogen gas and oxygen gas.

Specifically, in some embodiments, the gas oxidant is generated by combustion of the gas mixture using a pyrogenic external torch, such that the gaseous oxidant includes water vapor ($H_2O$), hydroxide ions ($OH^-$), hydroxyl radicals (HO•), or combinations thereof. Afterwards, the gaseous oxidant is purged into a reaction furnace where the structure shown in FIG. 5 is placed and the oxidation reaction of the outer part 36 (i.e., step S13) will occur. In some embodiments, the trimmed surface S3 of the outer part 36 is treated at a pressure ranging from about 100 torr to about 760 torr. In some embodiments, the trimmed surface S3 of the outer part 36 is treated at a temperature ranging from about 200° C. to about 400° C. In such temperature range, undesired diffusion of the impurities which are already doped in the lower and upper source/drain portions 29, 30 is less likely to occur.

In some other embodiments, the gas mixture is purged into a reaction chamber where the structure shown in FIG. 5 is placed and the oxidation reaction of the outer part 36 (i.e., step S13) will occur. The reaction chamber is maintained at a relatively low pressure, and the substrate 21 and the elements disposed thereon (see FIG. 5) is heated to a relatively high temperature. Since the heated substrate 21 and the elements disposed thereon provides an energy to promote the hydrogen gas and the oxygen gas to form the gaseous oxidant. Afterwards, the outer part 36 is in-situ oxidized to form the interfacial layer 37. In some embodiments, the pressure for generating the gaseous oxidant ranges from about 0.4 torr to about 20 torr. In some embodiments, the temperature for generating the gaseous oxidant ranges from about 600° C. to about 1100° C. In certain embodiments, the gaseous oxidant may include hydroxyl radicals (HO•), oxygen radicals (O•) and water vapor ($H_2O$).

In some yet other embodiments, a carrier gas may be purged into the reaction chamber for facilitating formation of the gaseous oxidant including hydroxyl radicals (HO•), oxygen radicals (O•) and water vapor ($H_2O$). In some embodiments, the carrier gas includes argon, helium, water vapor, or combinations thereof. In some embodiments, a plasma generator, for example, but not limited to, an inductively-coupled plasma (ICP) generator, a capacitively-coupled plasma (CCP) generator, an electron cyclotron resonance (ECR) plasma generator, or other suitable plasma generator may also be used for facilitating formation of the gaseous oxidant. In some embodiments, with the assistance of the carrier gas and the plasma generator, the gaseous oxidant including hydroxyl radicals (HO•), oxygen radicals (O•) and water vapor ($H_2O$) may occur at a relatively low temperature (e.g., a temperature ranging from about 200° C. to about 650° C.). In such temperature range, undesired diffusion of the impurities which are already doped in the lower and upper source/drain portions 29, 30 is less likely to occur.

It is to be understood that the ranges of value of process parameter(s) as mentioned above (e.g., temperature and pressure) is used for the purpose of describing particular embodiments only, and is not intended to limit the scope of the present disclosure. In some embodiments, process parameters(s) (e.g., temperature, pressure, flow rate of precursor gas, etc.) may be adjusted flexibly to control the amount of hydroxyl groups remaining on the treated surface S4, thereby increasing the quality of subsequent steps.

Referring to FIG. 1, the method 10 proceeds to step S14 where a dielectric portion (e.g., a gate dielectric layer) is formed on the hydroxyl group-terminated surface of the oxidized part.

Figure 9:
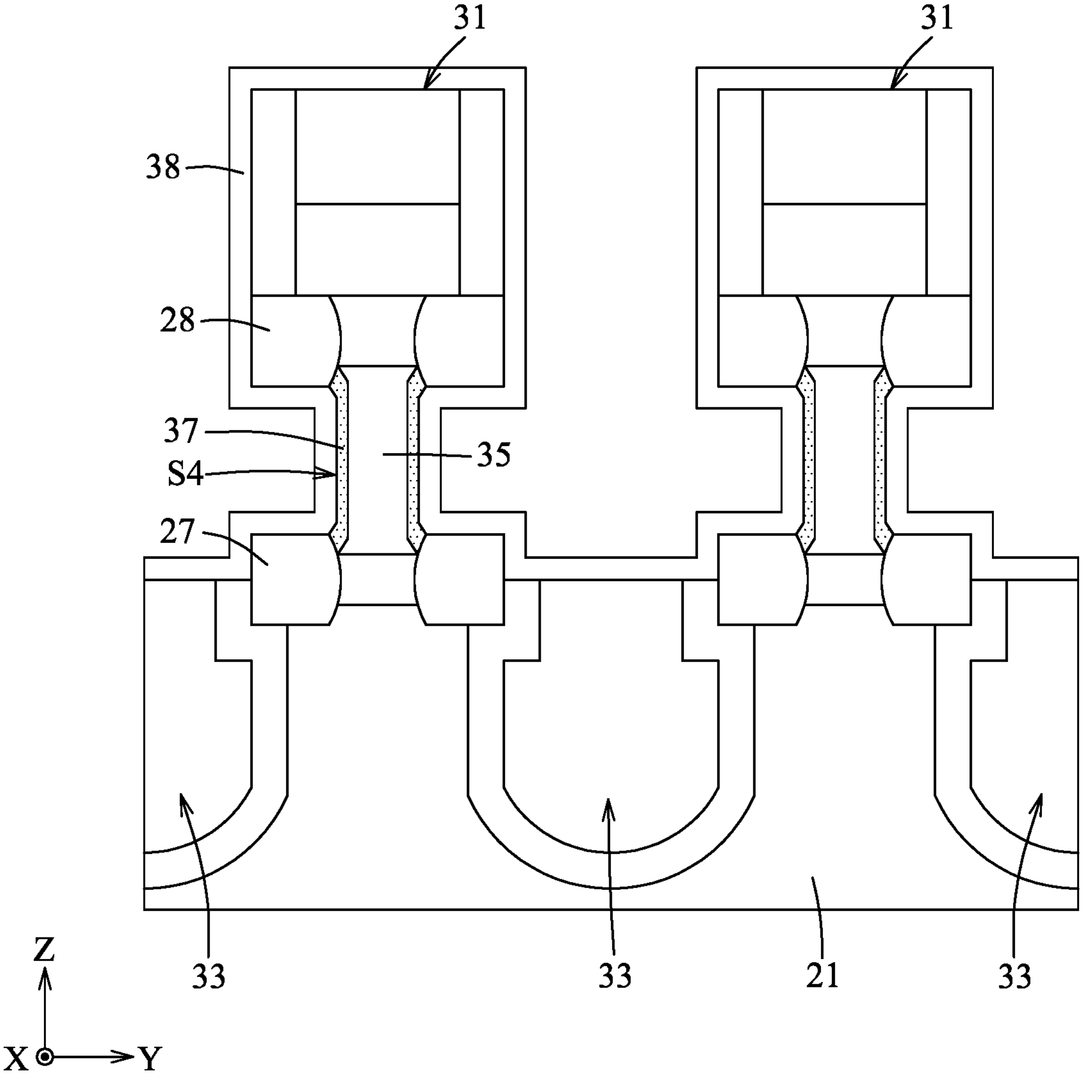

In some embodiments, as shown in FIG. 9 which is a view similar to that of FIG. 7, but illustrating the structure after step S14, a gate dielectric layer 38 is formed on the interfacial layer 37. In some embodiments, the gate dielectric layer 38 includes a high dielectric constant (high-k) material. In certain embodiments, the high-k dielectric material may be a metallic oxide, such as hafnium oxide, zirconium oxide, zirconium aluminum oxide, hafnium aluminum oxide, hafnium silicon oxide, aluminum oxide, and so on. Other suitable materials for the gate dielectric layer 38 are within the contemplated scope of the present disclosure. In some embodiments, the gate dielectric layer 38 is further formed on the protection portion 31, the lower and upper gate spacers 37, 38, and the isolation portions 33.

Figure 10:
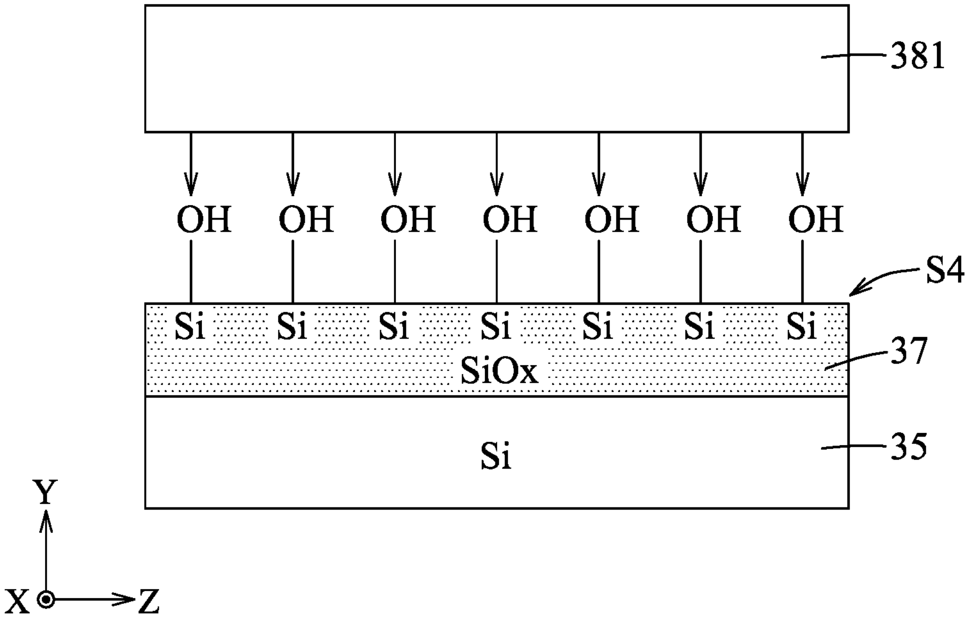

In some embodiments, the gate dielectric layer 38 is formed by ALD in a reaction chamber. Formation of the gate dielectric layer 38 using ALD may include a plurality of deposition cycles, in each of which a monoatomic layer of the gate dielectric layer 38 is deposited. Each of the deposition cycles includes a first reaction step and a second reaction step. FIG. 10 is a view similar to that of FIG. 8, but further illustrating a structure at the beginning of the first reaction step. In the first reaction step, a first precursor material 381, which includes metal elements for forming the gate dielectric layer 38 and functional groups suitably bonded to the metal elements, is delivered into the reaction chamber which is previously evacuated. In the first reaction step of the first deposition cycle, the hydroxyl groups terminated at the treated surface S4 of the interfacial layer 37 provides active sites for the first precursor material 381 to absorb (or nucleate) thereon, and then the first precursor material 381 further reacts with the hydroxyl groups. In some embodiments, when the gate dielectric layer 38 is made of hafnium oxide, the first precursor material 381 may be a hafnium-containing precursor. In some embodiments, when the gate dielectric layer 38 is made of zirconium oxide, the first precursor material 381 may be a zirconium-containing precursor, such as tetrakis[ethylmethylamino]zirconium (TEMAZr), or zirconium chloride ($ZrCl_4$), but is not limited thereto. After the first precursor material 381 is reacted with the hydroxyl groups to form a first precursor film (not shown) on the interfacial layer 37, a remainder of the first precursor material 381 is purged of the reaction chamber. Afterwards, in the second reaction step, a second precursor material (not shown) is delivered into the reaction chamber. When the gate dielectric layer 38 is a metallic oxide, the second precursor material is an oxygen-containing precursor for oxidizing the first precursor film such that a monoatomic layer of the gate dielectric layer 38 can be obtained. In some embodiments, the second precursor material includes ozone, water vapor, oxygen, or combinations thereof. In the first reaction step of the second or subsequent deposition cycle, the first precursor film may be formed on the monoatomic layer(s) of the gate dielectric layer 38 formed in the previous cycle(s), or on a part of the treated surface S4 of the interfacial layer 37 which is not covered by the monoatomic layer(s) of the gate dielectric layer 38 in the previous cycle(s). It is noted that the thickness of the gate dielectric layer 38 may be controlled by the number of the deposition cycles. Besides, it is believed that a growth rate of the gate dielectric layer 38 may be controlled by the number of the active sites (i.e., the number of the hydroxyl groups) at the treated surface S4.

Figure 11:
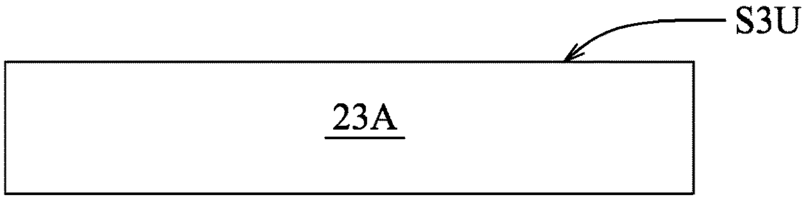
FIGS. 11 to 14 illustrate schematic views of intermediate stages for making Samples A to D which are respectively made by methods similar to steps S11 to S14 of the method depicted in FIG. 1 in accordance with some embodiments.
Figure 12:
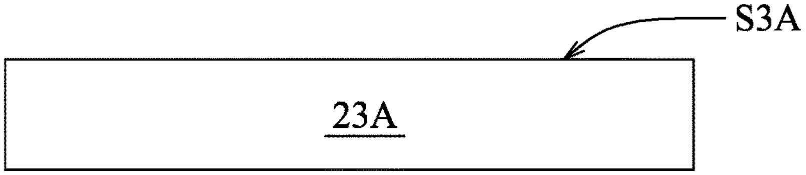
Figure 13:
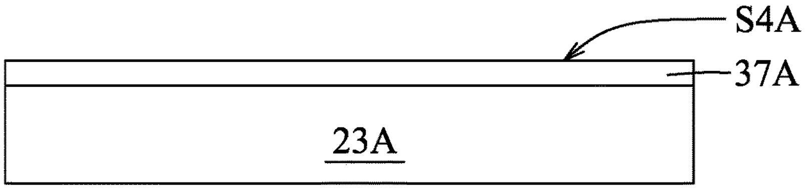
Figure 14:
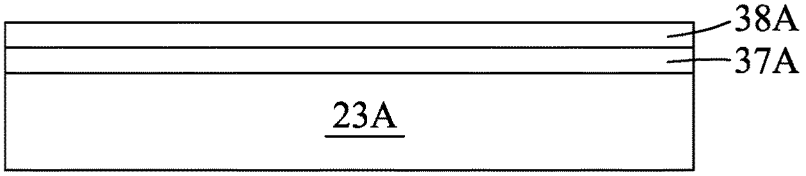

Sample A to D are subjected to time-of-flight secondary ion mass spectrometry (ToF-SIMS) analysis. Sample A is manufactured by Method A similar to steps S11 to S14 in the method 10. In step S11 of Method A, a bare silicon wafer 23A shown in FIG. 11 is prepared to serve as the semiconductor portion 23 in step S11 of the method 10. In step S12 of Method A, the bare silicon wafer 23A shown in FIG. 11 is trimmed by the gaseous halogen-based etchant used in step S12 of the method 10 to obtain a trimmed surface S3A (see FIG. 12). In step S13 of Method A, the trimmed surface S3A shown in FIG. 12 is treated at a temperature ranging from about 200° C. to 400° C. using the gaseous oxidant used in step S13 of the method 10 to form an oxide layer 37A having a treated surface S4A (see FIG. 13). In step S14 of Method A, as shown in FIG. 14, a gate dielectric layer 38A, which is made of hafnium oxide, is formed. Sample B is manufactured by Method B which is similar to Method A, but in step S13 of Method B, the trimmed surface S3A shown in FIG. 12 is treated at a temperature higher than that for Sample A. Sample C is manufactured by Method C similar to Method A, but trimming of the bare silicon wafer 23A (i.e., step S12) is skipped, and in step S13 of Method C, an untrimmed surface S3U of the bare silicon wafer 23A shown in FIG. 11 is cleaned by a wet clean process using dilute hydrofluoric acid (dHF) before being treated using the gaseous oxidant, so as to form an oxide layer (which is similar to the oxide layer 37A shown in FIG. 13, and is also denoted by 37A). Sample D is manufactured by Method D similar to Method C, but in step S13 of Method D. the untrimmed surface S3U of the bare silicon wafer 23A shown in FIG. 11 is cleaned by a wet clean process using dHF and then treated using a liquid-phase oxidant (e.g., ozonated aqueous solution, a mixture of sulfuric acid and hydrogen peroxide (SPM), a mixture of ammonium hydroxide, hydrogen peroxide and wafer, etc.) so as to form an oxide layer (which is similar to the oxide layer 37A shown in FIG. 13, and is also denoted by 37A).

Figure 15:
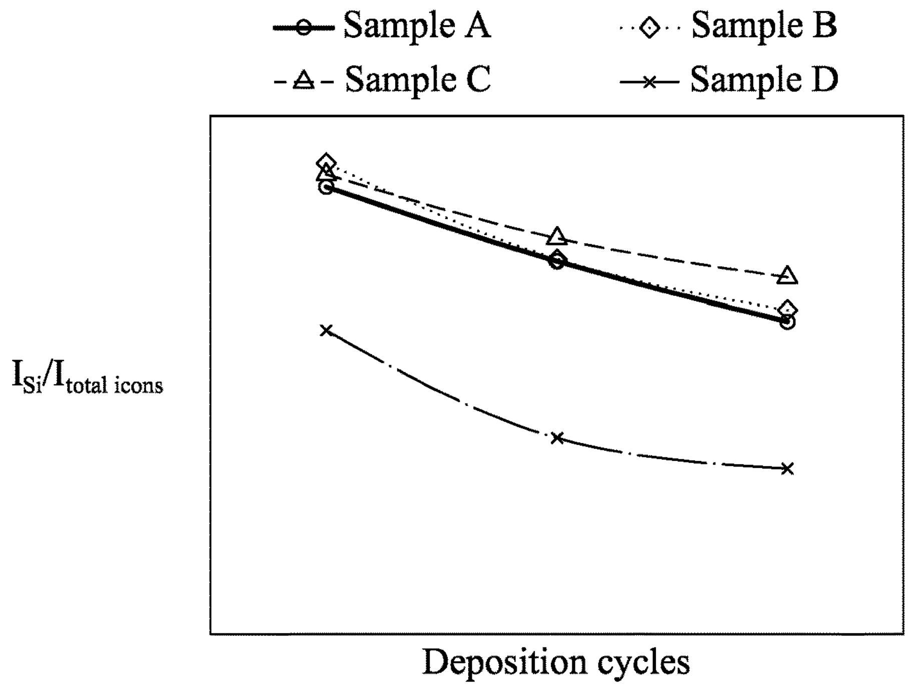
FIG. 15 illustrates variation in an intensity ratio of silicon to total ions over the number of deposition cycles for Samples A to D in accordance with some embodiments.
Figure 16:
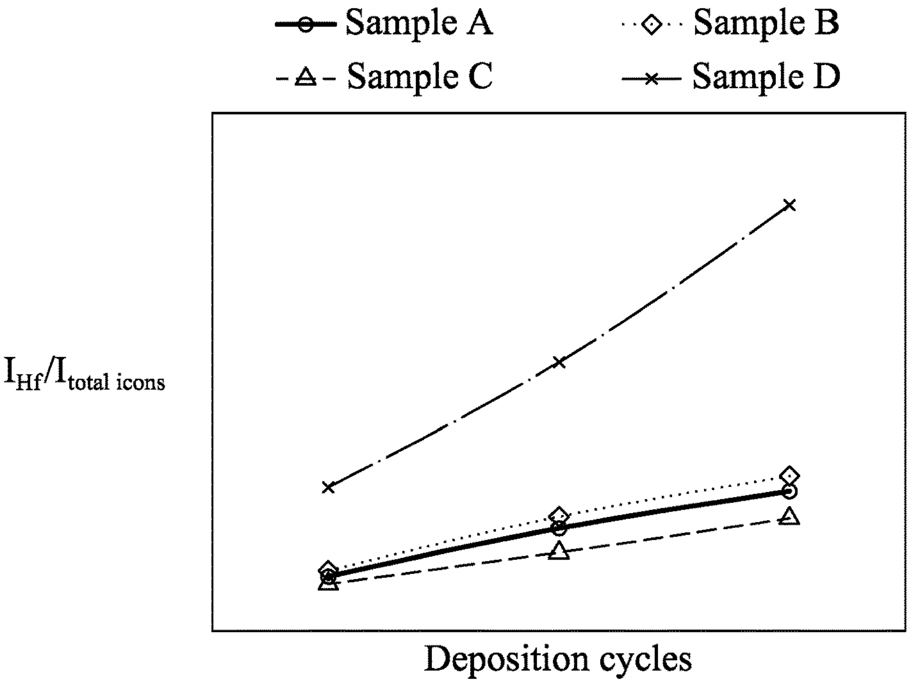
FIG. 16 illustrates variation in an intensity ratio of hafnium to total ions over the number of the deposition cycles for Samples A to D in accordance with some embodiments.

In the ToF-SIMS analysis, an intensity of silicon, hafnium and other ions can be detected from an upper surface of each of Samples A to D, and an intensity ratio of silicon to total ions (i.e., $I_{Si}/I_{total\ ions}$) and an intensity ratio of hafnium to total ions (i.e., $I_{Hf}/I_{total\ ions}$) can be further calculated. The value of $I_{Si}/I_{total\ ions}$ is considered to be positively correlated with an exposure degree of silicon exposed from the gate dielectric layer 38A obtained in step S14. The value of $I_{Hf}/I_{total\ ions}$ is considered to be positively correlated with an amount or a thickness of hafnium in the gate dielectric layer 38A. FIG. 15 illustrates variation in an intensity ratio of silicon to total ions (i.e., $I_{Si}/I_{total\ ions}$) over the number of the deposition cycles for Samples A to D during formation of the gate dielectric layer 38A using ALD in step S14. FIG. 16 illustrates variation in an intensity ratio of hafnium to total ions (i.e., $I_{Hf}/I_{total\ ions}$) over the number of the deposition cycles for Samples A to D during formation of the gate dielectric layer 38A using ALD in step S14.

As shown in FIGS. 15 and 16, for each of Samples A to D, the value of $I_{Hf}/I_{total\ ions}$ (i.e., a thickness of the gate dielectric layer 38A) increases as the number of the deposition cycles increases. On the contrary, the value of $I_{Si}/I_{total\ ions}$ decreases as the number of the deposition cycles increases, because the silicon in the oxide layer 37A, which is made of silicon oxide, becomes less and less detectable. In other words, an exposure degree of silicon oxide from the gate dielectric layer 38A decreases as the number of the deposition cycles increases.

It is worth noting that the value of $I_{Hf}/I_{total\ ions}$ of Sample A increases in a degree greater than that of Sample C in each of the deposition cycles, and the value of $I_{Si}/I_{total\ ions}$ of Sample A decreases in a degree greater than that of Sample C in each of the deposition cycles. It is believed that before step S13, the trimmed surface S3A of Sample A shown in FIG. 12 may have an amount of fluorine termination greater than that at the untrimmed surface S3U of Sample C shown in FIG. 11, and therefore, after the reaction as described above with reference to FIGS. 6 and 8 occurs in step S13, an amount of hydroxyl group termination at the treated surface S4A of Sample A shown in FIG. 13 is greater than that at the treated surface S4A of Sample C. Consequently, the treated surface S4A of Sample A obtained in step S13 provides more active sites for the first precursor material 381 (see FIG. 10) for forming the gate dielectric layer 38A (see FIG. 14) thereon, thereby obtaining a faster growth rate of the gate dielectric layer 38A.

Although the growth rate of the gate dielectric layer 38A of Sample A is lower than that of Sample D. it is worth noting that Method A is without the use of liquids. Since a spin-drying containing step is required usually after a wet process using liquid-phase chemical(s), and since the spin-drying containing step, which is performed before formation of the gate dielectric layer 38 shown in FIG. 9, may result in collapse of vertical features with a relatively small width, the wet process for forming Sample D may not be suitable for forming the structure shown in FIG. 7.

Therefore, Method A (or the method 10) is advantageous for forming the patterned structure including vertical features (e.g., the semiconductor portions 23), because defects resulted from collapse of the vertical features due to spin-dry step(s) may be reduced. It is noted that the process parameters (e.g., treated pressure, treated temperature, flow rate of precursor gases) may be further finely adjusted so as to provide the treated surface S4 that is rich in hydroxyl-group termination.

Although a methodology for measuring the amount of the halogens elements remaining on the trimmed surface S3 (or S3A) and/or the hydroxyl groups remaining on the treated surface S4 (or S4A) is under development, it can be seen from the analysis of the experiment as described above that the thickness and/or the quality of the gate dielectric layer 38A can be promoted by (i) providing the trimmed surface S3A with halogen termination by trimming the surface S3U using the gaseous halogen-based etchant, and then (ii) converting the trimmed surface S3A with halogen termination into the treated surface S4A with hydroxyl group termination using the gaseous oxidant.

Referring to FIG. 1, the method 10 proceeds to step S15 where a gate electrode is formed around the dielectric portion such that the semiconductor structure including the device units is obtained.

In some embodiments, as shown in FIG. 17 which is a view similar to that of FIG. 9, but illustrating the structure after step S15, a gate electrode 39 is formed over the gate dielectric layer 38 such that the semiconductor structure 40 including the device units 41 is obtained. In each of the device units 41, the inner part 35 and the upper region 25 together function as a channel 45 which extends between the lower and upper source/drain portions 29, 30. The gate electrode 39 is disposed around the channel 45, and is spaced apart from the channel 45 by gate dielectric layer 38. During operation of each of the device units 41, a flow of carriers (electrons or holes) or a current flow between the lower and upper source/drain portions 29, 30 may be controlled by the gate electrode 39.

In some embodiments, the gate electrode 39 may be configured as a multi-layered structure including at least one work function metal which is provided for adjusting threshold voltage of an n-FET or a p-FET, an electrically conductive material having a low resistance which is provided for increasing electrical conductivity of the gate electrode 39, other suitable materials, or combinations thereof. In some embodiments, the work function metal of the gate electrode 39 for forming an n-FET may be different from that for forming a p-FET so as to permit the n-FET and the p-FET to have different threshold voltages (Vth). In some embodiments, the work function metal of the gate electrode 39 for forming an n-FET may be the same as the work function metal of the gate electrode 39 for forming a p-FET. In this case, the work function metal layer for both the n-FET and the p-FET may have a mid-gap work function (that is, the work function metal layer has a Fermi-energy level that is close to half of energy levels of a conduction band edge and a valence band edge of the channel 45), and the threshold voltage of each of the n-FET and the p-FET may be adjusted through introduction of n-dipoles and/or p-dipoles into an interface between the interfacial layer 37 and the gate dielectric layer 38 of a corresponding one of the n-FET and the p-FET using a dipole process (for example, but not limited to, including deposition of dipole layer(s) which include p-dipoles and/or n-dipoles, followed by a thermal drive-in step and removal of the dipole layer(s)). Other suitable methods for adjusting the threshold voltages are within the contemplated scope of the present disclosure. In some embodiments, the gate electrode 39 includes a metal material (e.g., tungsten (W), titanium (Ti), tantalum (Ta), aluminum (Al), or ruthenium (Ru)), metal-containing nitrides (e.g., titanium nitride (TiN), or tantalum nitride (TaN)), metal-containing silicides (e.g., nickel silicide (NiSi)), metal-containing carbides (e.g., tantalum carbide (TaC)), or combinations thereof. In some embodiments, the gate electrode 39 may be formed over the gate dielectric layer 38 by ALD. Other suitable materials and/or processes for forming the gate electrode 39 are within the contemplated scope of the present disclosure.

FIG. 18 is a schematic view illustrating a spatial relationship between the device units 41 in the semiconductor structure 40 in accordance with some embodiments. A schematic cross-sectional view taken along line C-C' of FIG. 18 may have a structure similar to that of the semiconductor structure 40 shown in FIG. 17, but FIG. 18 schematically illustrates, without being drawn to scale, the relative positions among the lower and upper source/drain portions 29, 30, the channel 45, and the gate electrode 39 in each of the device units 41.

In some embodiments, each of the device units 41 may include a plurality of the channels 45, as shown in FIG. 18, while in some other embodiments, some of the device units 41 may include a plurality of the channels 45, and some of the device units 41 may include a single channel 45.

In some embodiments, the channel 45 may be configured as a nanowire. In certain embodiments, the nanowire of the channel 45 may have a diameter ranging from about 5 nm to 8 nm. In some other embodiments, the channel 45 may be configured as a nanosheet. In certain embodiments, the nanosheet of the channel 45 may have a thickness ranging from about 5 nm to 8 nm in the Y direction. In certain embodiments, the nanosheet of the channel 45 may have a width ranging from about 15 nm to 50 nm in the X direction.

In some embodiments, a plurality of the device units 41 may be arranged in the X direction on the same base structure 32. Although two of the base structures 32 are shown in FIG. 18, and two of the device units 41 is arranged on the same one of the base structures 32, the number of the device units 41 may vary according to practical and/or application requirements, and the device units 41 may be arranged in an array greater than 2 by 2.

In some alternative embodiments, some steps in the method 10 may be modified, replaced, or eliminated without departure from the spirit and scope of the present disclosure. In some alternative embodiments, the semiconductor structure 40 may further include additional features, and/or some features present in the semiconductor structure 40 may be modified, replaced, or eliminated without departure from the spirit and scope of the present disclosure. For example, a dipole-first process (for example, but not limited to, including deposition of dipole layer(s) which includes p-dipoles and/or n-dipoles on the interfacial layer 37, followed by a thermal drive-in step and removal of the dipole layer(s)) may be performed after step S13 and before step S14 for Vth tuning of the device units 41. In addition, the semiconductor structure 40 shown in FIG. 18 may be further formed with a plurality of backside vias (not shown) which respectively access the lower source/drain portions 29 of the device units 41.

In this disclosure, a sequential process steps, i.e., from post-processing of a silicon channel, formation of an interfacial layer, to formation of a high-k gate dielectric layer, is revealed. Although the silicon channel is in a nanoscale, since the post-processed silicon channel (i.e., the trimmed silicon channel which is obtained after being trimmed using a gaseous halogen-based etchant) has a halogen-terminated surface, the interfacial layer having a hydroxyl group-terminated surface can still be successfully formed on the trimmed silicon channel using a gaseous oxidant including hydrogen and oxygen [e.g., a compound including hydroxyl group (e.g., water vapor ($H_2O$), hydroxide ions ($OH^-$), hydroxyl radicals (HO•), or combinations thereof]. Accordingly, such interfacial layer with hydroxyl group termination is beneficial to formation of the high-k gate dielectric layer using ALD, thereby obtaining the high-k gate dielectric layer with high film quality. Notably, such sequential process steps are without the use of liquid-phase chemical(s). and, thus, defects resulting from collapse of vertical features (e.g., vertical silicon channels) due to spin-dry step(s) can be significantly reduced. Therefore, the method in this disclosure has the potential to increase yield rate of the semiconductor structure (or semiconductor device) including vertical features.

In accordance with some embodiments of the present disclosure, a method for manufacturing a semiconductor structure includes: trimming a semiconductor region using a gaseous halogen-based etchant such that the trimmed semiconductor region has a first part and a second part which is formed on the first part and which has a halogen-terminated trimmed surface; and treating the halogen-terminated trimmed surface of the second part using a gaseous oxidant including hydrogen and oxygen such that the second part is oxidized to form an oxidized part, and such that the halogen-terminated trimmed surface is converted into a hydroxyl group-terminated surface of the oxidized part.

In accordance with some embodiments of the present disclosure, the semiconductor region is made of silicon, and the gaseous halogen-based etchant includes fluorine, chlorine, or a combination thereof.

In accordance with some embodiments of the present disclosure, the gaseous halogen-based etchant includes fluorine, and a precursor gas for generating the gaseous etchant includes hydrogen fluoride and nitrogen trifluoride.

In accordance with some embodiments of the present disclosure, a precursor gas for generating the gas oxidant includes both hydrogen gas and oxygen gas.

In accordance with some embodiments of the present disclosure, a method for manufacturing a semiconductor structure includes: forming a semiconductor portion over a substrate, the semiconductor portion having a lower surface proximate to the substrate, an upper surface distal from the substrate, and an outer peripheral surface interconnecting the lower and upper surfaces; trimming a region of the semiconductor portion inward from the outer peripheral surface with a gaseous halogen-based etchant such that the trimmed region has an inner part and an outer part which surrounds the inner part, and which has an trimmed surface with halogen termination; treating the trimmed surface of the outer part with a gaseous oxidant including hydrogen and oxygen such that the outer part is oxidized to form an oxidized part, and such that the trimmed surface with halogen termination is converted into a treated surface of the oxidized part with hydroxyl group termination; and forming a dielectric portion on the oxidized part.

In accordance with some embodiments of the present disclosure, the region of the semiconductor portion is made of silicon, and the gaseous halogen-based etchant includes fluorine, chlorine, or a combination thereof.

In accordance with some embodiments of the present disclosure, after trimming the region of the semiconductor portion, halogen elements from the gaseous halogen-based etchant are bonded to silicon elements at the trimmed surface.

In accordance with some embodiments of the present disclosure, during treating the trimmed surface, the halogen elements originally bonded to the silicon elements reacts with the gas oxidant such that the halogen elements are removed in a form of gaseous hydrogen halide, and such that the hydroxyl groups are bonded to the silicon elements.

In accordance with some embodiments of the present disclosure, a precursor gas for generating the gaseous oxidant includes both hydrogen gas and oxygen gas.

In accordance with some embodiments of the present disclosure, the gaseous oxidant is generated by combustion of the precursor gas using a pyrogenic external torch, the gaseous oxidant including hydroxide ions ($OH^-$) and water vapor ($H_2O$).

In accordance with some embodiments of the present disclosure, the trimmed surface is treated at a pressure ranging from 100 torr to 760 torr.

In accordance with some embodiments of the present disclosure, the trimmed surface is treated at a temperature ranging from 200° C. to 400° C.

In accordance with some embodiments of the present disclosure, the trimmed surface is treated at a predetermined pressure ranging from 0.4 torr to 20 torr.

In accordance with some embodiments of the present disclosure, the gaseous hydrogen and the gaseous oxygen are formed into the gaseous oxidant including hydroxyl radicals, oxygen radicals and water vapor at the predetermined pressure.

In accordance with some embodiments of the present disclosure, a carrier gas for facilitating formation of the gaseous oxidant includes argon, helium, water vapor, or combinations thereof.

In accordance with some embodiments of the present disclosure, a method for manufacturing a semiconductor structure includes: forming a patterned structure which includes a substrate, a semiconductor portion formed over the substrate, the semiconductor portion including a lower region proximate to the substrate, an upper region distal from the substrate, and a middle region disposed between the lower and upper regions, and a lower gate spacer and an upper gate spacer respectively formed around the lower and upper regions such that the middle region is exposed from the lower and upper gate spacers; trimming the middle region using a gaseous halogen-based etchant such that the trimmed middle region has an inner part and an outer part which surrounds the inner part, and which has a halogen-terminated trimmed surface; treating the halogen-terminated trimmed surface of the outer part using a gaseous oxidant including hydrogen and oxygen such that the outer part is oxidized to form an interfacial layer disposed around the inner part, and such that the halogen-terminated trimmed surface is converted into a hydroxyl group-terminated treated surface of the interfacial layer; and forming a gate dielectric layer on the interfacial layer.

In accordance with some embodiments of the present disclosure, the patterned structure further includes a lower source/drain portion formed in the lower region, an upper source/drain portion formed on the upper region, and a protection portion formed to cover the upper source/drain portion so as to prevent the upper source/drain portion from being trimmed by the gaseous halogen-based etchant.

In accordance with some embodiments of the present disclosure, an outer surface of at least one of the lower and upper gate spacers is coincident with a first surface, and an inner surface of the at least one of the lower and upper gate spacers is coincident with a second surface. During trimming the middle region, the middle region is trimmed in a direction toward the second surface.

In accordance with some embodiments of the present disclosure, the middle region has an exposed surface exposed from the lower and upper gate spacers. Before trimming the middle region, the exposed surface of the middle region extends between the lower and upper gate spacers, and is located between the first and second surfaces.

In accordance with some embodiments of the present disclosure, the patterned structure further includes a base structure which is formed between the substrate and the lower source/drain portion, and two isolation portions which are formed on the substrate and which are respectively located at two opposite sides of the base structure.

In accordance with some embodiments of the present disclosure, the method further includes forming a gate electrode structure around the gate dielectric layer.

In accordance with some embodiments of the present disclosure, the gate dielectric layer is formed by atomic layer deposition.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure which includes a transistor, comprising:
- forming a patterned structure which includes
  - a substrate having an upper surface and a planar lower surface opposite to the upper surface,
  - a lower source/drain portion of the transistor disposed on the substrate,
  - a semiconductor region disposed on the lower source/drain portion, and
  - an upper source/drain portion of the transistor disposed on the semiconductor region, such that the semiconductor region extends lengthwise between the lower source/drain portion and the upper source/drain portion along a direction normal to the planar lower surface of the substrate;
- after forming the patterned structure, trimming the semiconductor region using a gaseous halogen-based etchant such that the trimmed semiconductor region has a first part which serves as a channel of the transistor, and a second part which is formed on the first part and which has a halogen-terminated trimmed surface, the channel extending lengthwise between the lower source/drain portion and the upper source/drain portion along the direction normal to the planar lower surface of the substrate; and
- treating the halogen-terminated trimmed surface of the second part using a gaseous oxidant including hydrogen and oxygen such that the second part is oxidized to form an oxidized part, and such that the halogen-terminated trimmed surface is converted into a hydroxyl group-terminated surface of the oxidized part.

2. The method as claimed in claim 1, wherein the semiconductor region is made of silicon, and the gaseous halogen-based etchant includes fluorine, chlorine, or a combination thereof, the method further comprising:
- depositing a gate dielectric layer of the transistor on the oxidized part; and
- forming a gate electrode of the transistor on the gate dielectric layer, the lower source/drain portion and the upper source/drain portion being respectively located at two opposite sides of the gate electrode along the direction normal to the planar lower surface of the substrate, the gate electrode including at least one metal layer and being spaced apart from the channel by the gate dielectric layer.

3. The method as claimed in claim 2, wherein the gaseous halogen-based etchant includes fluorine, and a precursor gas for generating the gaseous etchant includes hydrogen fluoride and nitrogen trifluoride.

4. The method as claimed in a claim 1, wherein a precursor gas for generating the gas oxidant includes both hydrogen gas and oxygen gas.

5. A method for manufacturing a semiconductor structure, comprising:

forming a semiconductor portion over a substrate, the semiconductor portion extending lengthwise along a direction normal to the substrate and having a lower surface proximate to the substrate, an upper surface distal from the substrate, and an outer peripheral surface interconnecting the lower surface and the upper surface;

trimming a region of the semiconductor portion inward from the outer peripheral surface with a gaseous halogen-based etchant such that the trimmed region has an inner part and an outer part which surrounds the inner part, and which has an trimmed surface with halogen termination;

treating the trimmed surface of the outer part with a gaseous oxidant including hydrogen and oxygen such that the outer part is oxidized to form an oxidized part, and such that the trimmed surface with halogen termination is converted into a treated surface of the oxidized part with hydroxyl group termination; and forming a dielectric portion on the oxidized part opposite to the inner part, the dielectric portion including metal elements.

6. The method as claimed in claim 5, wherein the region of the semiconductor portion is made of silicon, the inner part serves as a channel of a transistor, and the gaseous halogen-based etchant includes fluorine, chlorine, or a combination thereof.

7. The method as claimed in claim 6, wherein after trimming the region of the semiconductor portion, halogen elements from the gaseous halogen-based etchant are bonded to silicon elements at the trimmed surface.

8. The method as claimed in a claim 7, wherein during treating the trimmed surface, the halogen elements originally bonded to the silicon elements reacts with the gas oxidant such that the halogen elements are removed in a form of gaseous hydrogen halide, and such that the hydroxyl groups are bonded to the silicon elements.

9. The method as claimed in claim 5, wherein a precursor gas for generating the gaseous oxidant includes both hydrogen gas and oxygen gas.

10. The method as claimed in claim 9, wherein the gaseous oxidant is generated by combustion of the precursor gas using a pyrogenic external torch, the gaseous oxidant including hydroxide ions and water vapor.

11. The method as claimed in claim 10, wherein the trimmed surface is treated at a pressure ranging from 100 torr to 760 torr.

12. The method as claimed in claim 11, wherein the trimmed surface is treated at a temperature ranging from 200° C. to 400° C.

13. The method as claimed in claim 9, wherein the trimmed surface is treated at a predetermined pressure ranging from 0.4 torr to 20 torr.

14. The method as claimed in claim 13, wherein the gaseous hydrogen and the gaseous oxygen are formed into the gaseous oxidant including hydroxyl radicals, oxygen radicals and water vapor at the predetermined pressure.

15. The method as claimed in claim 14, wherein a carrier gas for facilitating formation of the gaseous oxidant includes argon, helium, water vapor, or combinations thereof.

16. A method for manufacturing a semiconductor structure, comprising:

forming a patterned structure which includes a substrate having an upper surface and a planar lower surface opposite to the upper surface, a semiconductor portion formed over the upper surface of the substrate, the semiconductor portion including a lower region proximate to the substrate, an upper region distal from the substrate, and a middle region disposed between the lower region and the upper region, and a lower gate spacer and an upper gate spacer respectively formed around the lower region and the upper region such that the middle region is exposed from the lower gate spacer and the upper gate spacer, a width of the middle region being greater than a width of each of the upper region and the lower region when measured along a direction parallel to the planar lower surface of the substrate;

trimming the middle region using a gaseous halogen-based etchant such that the trimmed middle region has an inner part and an outer part which surrounds the inner part, and which has a halogen-terminated trimmed surface;

treating the halogen-terminated trimmed surface of the outer part using a gaseous oxidant including hydrogen and oxygen such that the outer part is oxidized to form an interfacial layer disposed around the inner part, and such that the halogen-terminated trimmed surface is converted into a hydroxyl group-terminated treated surface of the interfacial layer; and forming a gate dielectric layer on the interfacial layer.

17. The method as claimed in claim 16, wherein the patterned structure further includes a lower source/drain portion formed in the lower region, an upper source/drain portion formed on the upper region, and a protection portion formed to cover the upper source/drain portion so as to prevent the upper source/drain portion from being trimmed by the gaseous halogen-based etchant.

18. The method as claimed in claim 17, wherein the patterned structure further includes a base structure which is formed between the substrate and the lower source/drain portion, and two isolation portions which are formed on the substrate and which are respectively located at two opposite sides of the base structure.

19. The method as claimed in claim 16, wherein:

the lower gate spacer and the upper gate spacer includes silicon nitride, silicon carbide, silicon oxynitride, silicon oxycarbide, silicon carbonitride, silicon oxycarbonitride, or combinations thereof;

an outer surface of one of the lower gate spacer and the upper gate spacer is coincident with a first surface, and an inner surface of the one of the lower gate spacer and the upper gate spacer is coincident with a second surface; and during trimming the middle region, the middle region is trimmed in a direction toward the second surface.

20. The method as claimed in claim 19, wherein:

the middle region has an exposed surface exposed from the lower gate spacer and the upper gate spacer; and before trimming the middle region, the exposed surface of the middle region extends between the lower gate spacer and the upper gate spacer, and is located between the first surface and the second surface.

* * * * *